US011383499B2

(12) United States Patent
Sugimoto et al.

(10) Patent No.: US 11,383,499 B2
(45) Date of Patent: Jul. 12, 2022

(54) INSULATING SHEET AND LAMINATE

(71) Applicant: SEKISUI CHEMICAL CO., LTD., Osaka (JP)

(72) Inventors: Masataka Sugimoto, Osaka (JP); Keigo Oowashi, Osaka (JP); Kouji Ashiba, Osaka (JP); Yuko Kawahara, Tsukuba (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 77 days.

(21) Appl. No.: 16/611,148

(22) PCT Filed: May 9, 2018

(86) PCT No.: PCT/JP2018/017934
§ 371 (c)(1),
(2) Date: Nov. 5, 2019

(87) PCT Pub. No.: WO2018/207820
PCT Pub. Date: Nov. 15, 2018

(65) Prior Publication Data
US 2020/0079063 A1 Mar. 12, 2020

(30) Foreign Application Priority Data
May 10, 2017 (JP) .............................. JP2017-094257

(51) Int. Cl.
*B32B 27/18* (2006.01)
*C08K 3/38* (2006.01)
*C01B 21/064* (2006.01)

(52) U.S. Cl.
CPC ............ *B32B 27/18* (2013.01); *C01B 21/064* (2013.01); *C08K 3/38* (2013.01); *B32B 2307/304* (2013.01); *C08K 2003/385* (2013.01); *Y10T 428/25* (2015.01)

(58) Field of Classification Search
None
See application file for complete search history.

(56) References Cited

U.S. PATENT DOCUMENTS

| | | | |
|---|---|---|---|
| 5,527,604 A | 6/1996 | Hayashi | |
| 5,567,917 A | 10/1996 | Hayashi | |
| 5,578,366 A | 11/1996 | Hayashi | |
| 5,578,367 A | 11/1996 | Hayashi | |
| 5,648,156 A | 7/1997 | Hayashi | |
| 5,648,157 A | 7/1997 | Hayashi | |
| 5,670,241 A | 9/1997 | Hayashi | |
| 5,820,972 A | 10/1998 | Hayashi | |
| 5,834,101 A | 11/1998 | Hayashi | |
| 2006/0204733 A1 | 9/2006 | Murai et al. | |
| 2014/0079913 A1 | 3/2014 | Nishiyama et al. | |
| 2015/0252242 A1* | 9/2015 | Pham ................. | C09K 5/14 252/75 |
| 2017/0355894 A1* | 12/2017 | Zhu .................... | C08K 3/04 |
| 2019/0092994 A1* | 3/2019 | Gwin ................. | C08K 3/22 |

FOREIGN PATENT DOCUMENTS

| | | |
|---|---|---|
| CN | 1106606 A | 8/1995 |
| EP | 2 692 526 A1 | 2/2014 |
| GB | 2 280 782 A | 2/1995 |
| JP | 7-50460 A | 2/1995 |
| JP | 2006-270065 A | 10/2006 |
| JP | 2012-64691 A | 3/2012 |
| JP | 2013-39834 A | 2/2013 |
| JP | 2015-168783 A | 9/2015 |

OTHER PUBLICATIONS

Supplementary European Search Report for the Application No. EP 18 799 236.7 dated Dec. 22, 2020.
International Search Report for the Application No. PCT/JP2018/017934 dated Jul. 17, 2018.
Written Opinion of the International Searching Authority (PCT/ISA/237) for Application No. PCT/JP2018/017934 dated Jul. 17, 2018.
The First Office Action for the Application No. 201880029532.4 from The State Intellectual Property Office of the People's Republic of China dated Oct. 10, 2020.

* cited by examiner

*Primary Examiner* — Cheng Yuan Huang
(74) *Attorney, Agent, or Firm* — Cheng Law Group, PLLC

(57) ABSTRACT

Provided is an insulating sheet capable of effectively enhancing thermal conduction and adhesiveness and effectively suppressing variation in the adhesiveness. The insulating sheet according to the present invention contains a thermosetting component and boron nitride, the insulating sheet has a first surface on one side in a thickness direction and a second surface on the other side in the thickness direction, and a first average aspect ratio of the boron nitride in a region having a thickness of 10% of a thickness of the sheet, from the first surface toward the second surface is smaller than a second average aspect ratio of the boron nitride in a region having a thickness of 90% of a thickness of the sheet, from the second surface toward the first surface.

5 Claims, 3 Drawing Sheets

[FIG. 1]
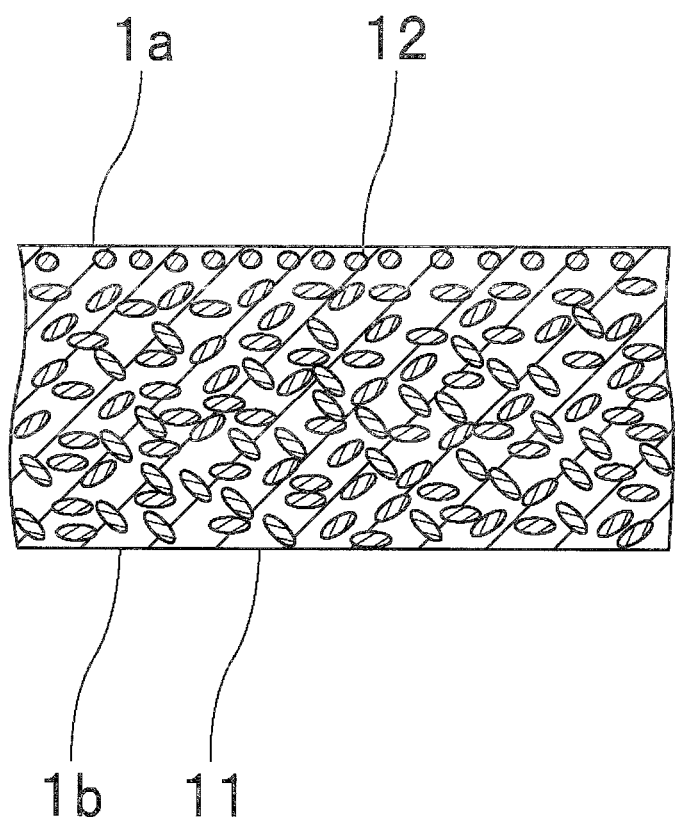

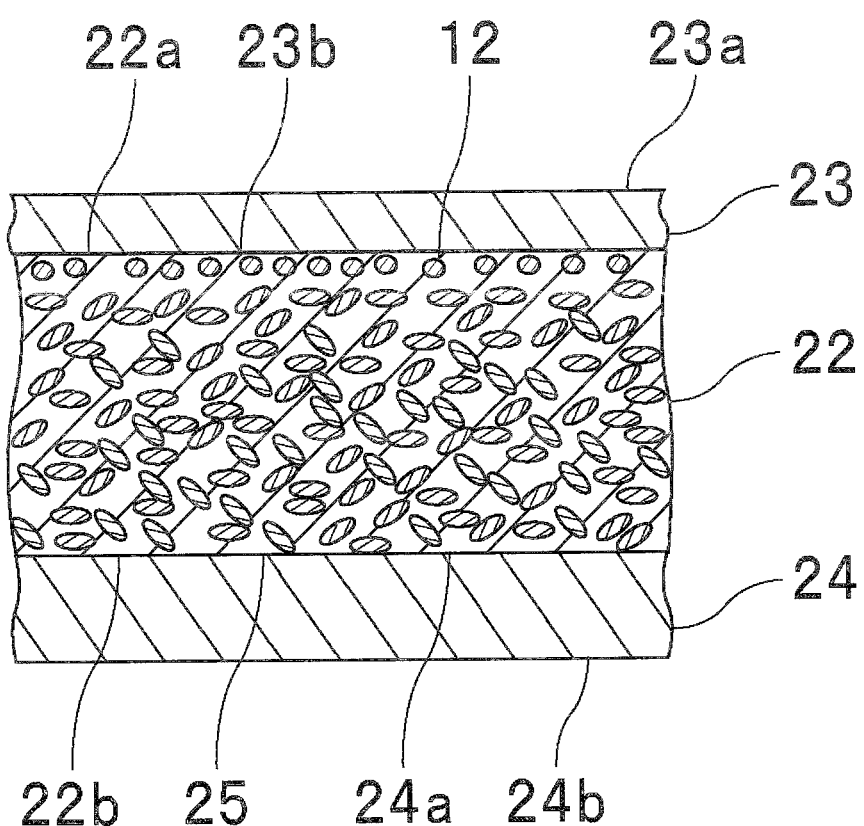
[FIG. 2]

[FIG. 3]
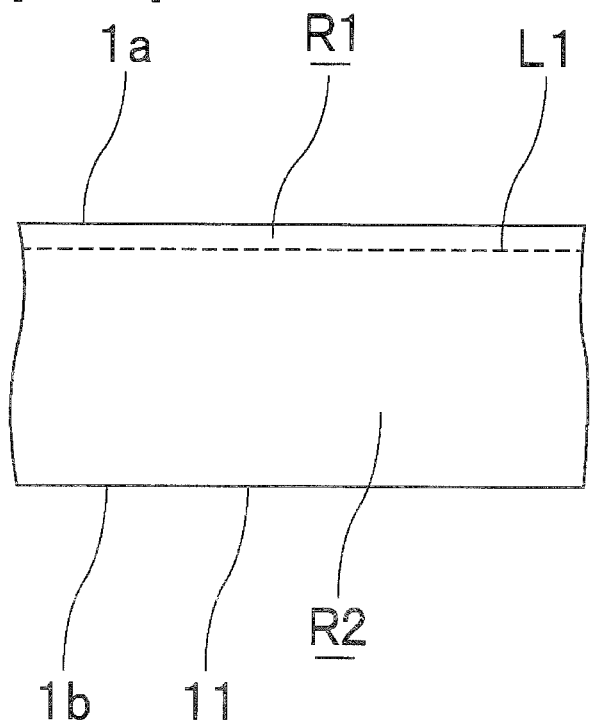
[FIG. 4]
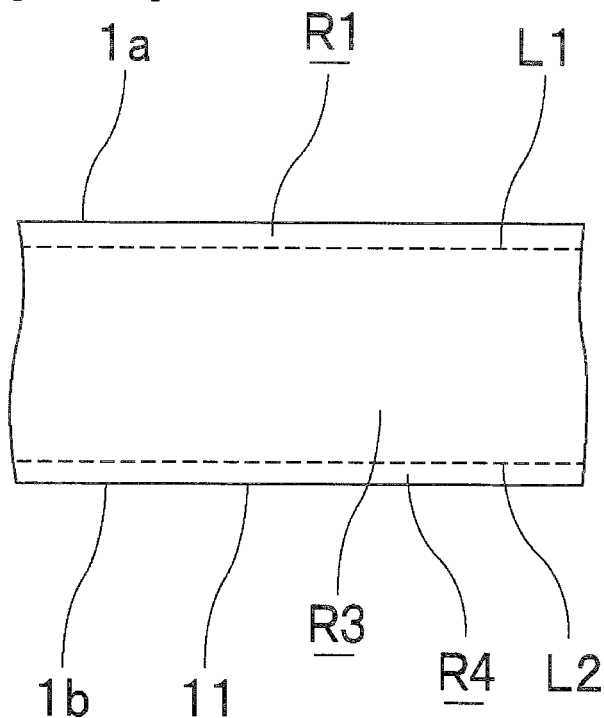

INSULATING SHEET AND LAMINATE

TECHNICAL FIELD

The present invention relates to an insulating sheet containing a thermosetting component and boron nitride. The present invention also relates to a laminate using the insulating sheet.

BACKGROUND ART

Electronic and electrical apparatuses have recently been downsized and allowed to have higher performance, and thus electronic components have been mounted with a higher package density. Thus, how to dissipate heat generated from the electronic component in a narrow space is a problem. Since the heat generated from the electronic component is directly linked to reliability of electronic and electrical apparatuses, efficient dissipation of the generated heat is an urgent issue.

As one means for solving the above problems, there is a means using a ceramic substrate having high thermal conduction as a heat dissipation substrate on which a power semiconductor device or the like is mounted. Examples of such a ceramic substrate include an alumina substrate and an aluminum nitride substrate.

However, the means using a ceramic substrate has problems that it is difficult to form a multilayer, processability is poor, and the cost is very high. In addition, since a difference in linear expansion coefficient between the ceramic substrate and a copper circuit is large, there is also a problem that the copper circuit tends to peel off during a cooling and heating cycle.

Thus, a resin composition using boron nitride having a low linear expansion coefficient, in particular, hexagonal boron nitride has attracted attention as a heat dissipation material. A crystal structure of hexagonal boron nitride is a layered structure of a hexagonal network similar to graphite, and a particle shape of hexagonal boron nitride is scaly. Thus, it is known that hexagonal boron nitride has a property that the thermal conductivity in the plane direction is higher than the thermal conductivity in the thickness direction, and the thermal conductivity is anisotropic. The resin composition described above may be used by being formed into a resin sheet or the like.

As an example of a resin sheet containing boron nitride, the following Patent Document 1 discloses a multilayer resin sheet having a resin composition layer and an adhesive layer. The resin composition layer contains a thermosetting resin and a filler. The adhesive layer is disposed on at least one surface of the resin composition layer. Arithmetic average roughness Ra of the adhesive layer at a surface that does not face the resin composition layer is 1.5 µm or less. The filler includes a boron nitride filler.

RELATED ART DOCUMENT

Patent Document

Patent Document 1: JP 2013-039834 A

SUMMARY OF THE INVENTION

Problems to be Solved by the Invention

The conventional resin sheet containing boron nitride as described in Patent Document 1 may be laminated on copper foil, a metal plate, or the like to be used as a laminate.

In the conventional resin sheet containing boron nitride as described in Patent Document 1, although the thermal conduction can be enhanced because boron nitride is used, it is difficult to enhance adhesiveness between the resin sheet and the copper foil. In the conventional resin sheet containing boron nitride, it is difficult to achieve both the thermal conduction and the adhesiveness.

Furthermore, in the conventional resin sheet containing boron nitride, an area of an end surface on which a relatively large number of functional groups of boron nitride are present may be small. As a result, the adhesiveness between the resin sheet and the copper foil may vary.

An object of the present invention is to provide an insulating sheet capable of effectively enhancing thermal conduction and adhesiveness and capable of effectively suppressing variation in the adhesiveness. It is also an object of the present invention to provide a laminate using the insulating sheet.

Means for Solving the Problems

According to a broad aspect of the present invention, an insulating sheet containing a thermosetting component and boron nitride is provided. The insulating sheet has a first surface on one side in a thickness direction and a second surface on the other side in the thickness direction, and a first average aspect ratio of the boron nitride in a region having a thickness of 10% of a thickness of the sheet, from the first surface toward the second surface is smaller than a second average aspect ratio of the boron nitride in a region having a thickness of 90% of a thickness of the sheet, from the second surface toward the first surface.

In a specific aspect of the insulating sheet according to the present invention, an absolute value of a difference between the first average aspect ratio and the second average aspect ratio is 1 or more and 20 or less.

In a specific aspect of the insulating sheet according to the present invention, the first average aspect ratio is 2 or more and 20 or less.

In a specific aspect of the insulating sheet according to the present invention, an average major diameter of the boron nitride of the entire insulating sheet is 1 µm or more and 40 µm or less.

In a specific aspect of the insulating sheet according to the present invention, a content of the boron nitride is 20% by volume or more and 80% by volume or less in 100% by volume of the insulating sheet.

According to a broad aspect of the present invention, there is provided a laminate including a thermal conductor, an insulating layer laminated on one surface of the thermal conductor, and a conductive layer laminated on a surface of the insulating layer opposite to the thermal conductor. In this laminate, a material of the insulating layer is the insulating sheet described above.

Effect of the Invention

The insulating sheet according to the present invention contains the thermosetting component and boron nitride. The insulating sheet according to the present invention has the first surface on one side in the thickness direction and the second surface on the other side in the thickness direction. In the insulating sheet according to the present invention, the first average aspect ratio of the boron nitride in the region having a thickness of 10% of the thickness of the sheet, from the first surface toward the second surface is smaller than the second average aspect ratio of the boron nitride in the region having a thickness of 90% of the thickness of the sheet, from the second surface toward the first surface.

Since the insulating sheet according to the present invention is provided with the above-mentioned configuration, thermal conduction and adhesiveness can be effectively enhanced, and variation in the adhesiveness can be effectively suppressed.

BRIEF DESCRIPTION OF DRAWINGS

FIG. 1 is a cross-sectional view schematically showing an insulating sheet according to one embodiment of the present invention.

FIG. 2 is a cross-sectional view schematically showing a laminate obtained using the insulating sheet according to one embodiment of the present invention.

FIG. 3 is a schematic view for explaining each region for which an average aspect ratio of boron nitride is to be obtained in the insulating sheet according to the present invention.

FIG. 4 is a schematic view for explaining each region for which the average aspect ratio of boron nitride is to be obtained in the insulating sheet according to the present invention.

MODE(S) FOR CARRYING OUT THE INVENTION

Hereinafter, the present invention will be described in detail.

(Insulating Sheet)

An insulating sheet according to the present invention contains a thermosetting component and boron nitride. The insulating sheet according to the present invention has the first surface on one side in the thickness direction and the second surface on the other side in the thickness direction. In the insulating sheet according to the present invention, the first surface and the second surface face each other. In the insulating sheet according to the present invention, a first average aspect ratio of the boron nitride in a region having a thickness of 10% of a thickness of the sheet, from the first surface toward the second surface is smaller than a second average aspect ratio of the boron nitride in a region having a thickness of 90% of a thickness of the sheet, from the second surface toward the first surface.

Since the insulating sheet according to the present invention is provided with the above-mentioned configuration, thermal conduction and adhesiveness can be effectively enhanced, and variation in the adhesiveness can be effectively suppressed.

In the insulating sheet according to the present invention, the average aspect ratio of boron nitride in a region near the first surface of the insulating sheet is relatively small, and an area of an end surface of boron nitride is relatively large. Functional groups such as hydroxyl and amino groups are present on the end surface, and in boron nitride in the region near the first surface of the insulating sheet, the amount of functional groups such as hydroxyl and amino groups contributing to adhesiveness can be increased. As a result, when a conductive layer such as copper foil is laminated on the first surface of the insulating sheet, it is possible to effectively enhance adhesiveness between the insulating sheet and the conductive layer and to effectively suppress variation in the adhesiveness between the insulating sheet and the conductive layer. Furthermore, the thermal conduction of the insulating sheet can be more effectively enhanced by increasing the average aspect ratio of boron nitride in a region other than the region near the first surface of the insulating sheet.

In the present invention, a first average aspect ratio of the boron nitride in the region (R1) having a thickness of 10% of the thickness of the sheet, from the first surface toward the second surface is smaller than a second average aspect ratio of the boron nitride in the region (R2) having a thickness of 90% of the thickness of the sheet, from the second surface toward the first surface. The region (R1) is a region between a first surface 1a and a broken line L1 in FIG. 3. The region (R2) is a region between a second surface 1b and the broken line L1 in FIG. 3.

The first average aspect ratio of boron nitride in the region (R1) is preferably 2 or more, more preferably 3 or more, further preferably 4 or more, and preferably 20 or less, more preferably 12 or less, further preferably 10 or less, particularly preferably 8 or less. When the first average aspect ratio is in the range from the above lower limit to the above upper limit inclusive, the thermal conduction and the adhesiveness can be more effectively enhanced, and variation in the adhesiveness can be more effectively suppressed.

The second average aspect ratio of boron nitride in the region (R2) is preferably 6 or more, more preferably 8 or more, further preferably 10 or more, and preferably 25 or less, more preferably 23 or less, further preferably 21 or less. When the second average aspect ratio is in the range from the above lower limit to the above upper limit inclusive, the thermal conduction and the adhesiveness can be more effectively enhanced, and variation in the adhesiveness can be more effectively suppressed.

An absolute value of a difference between the first average aspect ratio and the second average aspect ratio is preferably 1 or more, more preferably 2 or more, further preferably 3 or more, and preferably 20 or less, more preferably 15 or less, further preferably 13 or less. When the absolute value of the difference between the first average aspect ratio and the second average aspect ratio is in the range from the above lower limit to the above upper limit inclusive, the thermal conduction and the adhesiveness can be more effectively enhanced, and variation in the adhesiveness can be more effectively suppressed.

The first average aspect ratio of the boron nitride in the region (R1) having a thickness of 10% of the thickness of the sheet, from the first surface toward the second surface is preferably smaller than a third average aspect ratio of the boron nitride in a region (R3) having a thickness of 80% of the thickness of the sheet, that is from a position $\frac{1}{10}$ of the thickness of the sheet to a position $\frac{9}{10}$ of the thickness of the sheet from the first surface toward the second surface. The region (R1) is a region between the first surface 1a and a broken line L1 in FIG. 4. The region (R3) is a region between the broken line L1 and a broken line L2 in FIG. 4.

The third average aspect ratio of boron nitride in the region (R3) is preferably 6 or more, more preferably 8 or more, further preferably 10 or more, and preferably 25 or less, more preferably 23 or less, further preferably 21 or less. When the third average aspect ratio is in the range from the above lower limit to the above upper limit inclusive, the thermal conduction and the adhesiveness can be more effectively enhanced, and variation in the adhesiveness can be more effectively suppressed.

An absolute value of a difference between the first average aspect ratio and the third average aspect ratio is preferably 1 or more, more preferably 2 or more, further preferably 3 or more, and preferably 20 or less, more preferably 15 or less, further preferably 13 or less. When the absolute value of the difference between the first average aspect ratio and the third average aspect ratio is in the range from the above lower limit to the above upper limit inclusive, the thermal conduction and the adhesiveness can be more effectively enhanced, and variation in the adhesiveness can be more effectively suppressed.

A fourth average aspect ratio of the boron nitride in a region (R4) having a thickness of 10% of the thickness of the sheet, from the second surface toward the first surface is preferably smaller than the third average aspect ratio of the boron nitride in the region (R3) having a thickness of 80% of the thickness of the sheet, that is from a position 1/10 of the thickness of the sheet to a position 9/10 of the thickness of the sheet from the first surface toward the second surface. The region (R4) is a region between the second surface 1b and the broken line L2 in FIG. 4. The region (R3) is a region between the broken line L1 and a broken line L2 in FIG. 4.

The fourth average aspect ratio of boron nitride in the region (R4) is preferably 2 or more, more preferably 3 or more, further preferably 4 or more, and preferably 12 or less, more preferably 10 or less, further preferably 8 or less. When the fourth average aspect ratio is in the range from the above lower limit to the above upper limit inclusive, the thermal conduction and the adhesiveness can be more effectively enhanced, and variation in the adhesiveness can be more effectively suppressed.

An absolute value of a difference between the fourth average aspect ratio and the third average aspect ratio is preferably 1 or more, more preferably 2 or more, further preferably 3 or more, and preferably 20 or less, more preferably 15 or less, further preferably 13 or less. When the absolute value of the difference between the fourth average aspect ratio and the third average aspect ratio is in the range from the above lower limit to the above upper limit inclusive, the thermal conduction and the adhesiveness can be more effectively enhanced, and variation in the adhesiveness can be more effectively suppressed.

The first average aspect ratio of boron nitride in the region (R1) can be calculated from an electron microscope image of a cross section of a sheet or a laminate produced by pressing the insulating sheet. The second average aspect ratio of boron nitride in the region (R2) can be calculated from an electron microscope image of a cross section of a sheet or a laminate produced by pressing the insulating sheet. The third average aspect ratio of boron nitride in the region (R3) can be calculated from an electron microscope image of a cross section of a sheet or a laminate produced by pressing the insulating sheet. The fourth average aspect ratio of boron nitride in the region (R4) can be calculated from an electron microscope image of a cross section of a sheet or a laminate produced by pressing the insulating sheet.

The present specification also provides an insulating sheet having the following first to third configurations.

First configuration: One insulating sheet contains a thermosetting component and boron nitride.

Second configuration: The insulating sheet has a first surface on one side in a thickness direction and a second surface on the other side in the thickness direction.

Third configuration: A first average aspect ratio of the boron nitride in a region having a thickness of 10% of the thickness of the sheet, from the first surface toward the second surface is smaller than a third average aspect ratio of the boron nitride in a region having a thickness of 80% of the thickness of the sheet, that is from a position 1/10 of the thickness of the sheet to a position 9/10 of the thickness of the sheet from the first surface toward the second surface.

In the insulating sheet having the above first to third configurations, the configuration in which the first average aspect ratio of the boron nitride in the region having a thickness of 10% of the thickness of the sheet, from the first surface toward the second surface is smaller than a second average aspect ratio of the boron nitride in a region having a thickness of 90% of the thickness of the sheet, from the second surface toward the first surface is not necessarily provided.

(Boron Nitride)

The insulating sheet according to the present invention contains boron nitride. The boron nitride is not particularly limited, and examples thereof include hexagonal boron nitride, cubic boron nitride, boron nitride prepared by a reduction-nitridation method using a boron compound and ammonia, boron nitride prepared from a boron compound and a nitrogen-containing compound such as melamine, and boron nitride prepared from sodium borohydride and ammonium chloride. From the viewpoint of more effectively enhancing the thermal conduction, the boron nitride is preferably hexagonal boron nitride.

The boron nitride may constitute boron nitride agglomerated particles. The boron nitride agglomerated particles are agglomerated particles formed by aggregation of boron nitride (primary particles).

The primary particles constituting the boron nitride agglomerated particles may be scaly or in a bent shape.

From the viewpoint of more effectively enhancing the thermal conduction and the adhesiveness and more effectively suppressing variation in the adhesiveness, an average aspect ratio of the boron nitride of the entire insulating sheet is preferably 2 or more and more preferably 4 or more, and preferably 25 or less and more preferably 20 or less. When the boron nitride constitutes the boron nitride agglomerated particles, the average aspect ratio of the boron nitride means the average aspect ratio of boron nitride (primary particle) constituting the boron nitride agglomerated particles.

The aspect ratio of the boron nitride represents a major diameter/minor diameter. The average aspect ratio of the boron nitride is obtained by mixing the boron nitride or the primary particles constituting the boron nitride agglomerated particles with thermosetting resin or the like, measuring the major diameter/minor diameter of each of 50 boron nitride particles (primary particles) randomly selected from an electron microscope image of a cross section of a sheet or a laminate produced by pressing, and calculating an average value. When the primary particle has a bent shape, the primary particle is divided into two parts at a bending point, and the major diameter is measured for the two divided parts. The major diameter/minor diameter calculated from the part with a larger major diameter is taken as the major diameter/minor diameter of the primary particle.

From the viewpoint of more effectively enhancing the thermal conduction and the adhesiveness and more effectively suppressing variation in the adhesiveness, an average major diameter of the boron nitride of the entire insulating sheet is preferably 1 μm or more and more preferably 2 μm or more, and preferably 40 μm or less and more preferably 35 μm or less. When the boron nitride constitutes the boron nitride agglomerated particles, the average major diameter of the boron nitride means the average major diameter of boron nitride (primary particle) constituting the boron nitride agglomerated particles.

The average major diameter of the boron nitride is obtained by mixing the boron nitride or the primary particles constituting the boron nitride agglomerated particles with thermosetting resin or the like, measuring the major diameter of each of 50 boron nitride particles (primary particles) randomly selected from an electron microscope image of a cross section of a sheet or a laminate produced by pressing, and calculating an average value. When the primary particle has a bent shape, the primary particle is divided into two parts at a bending point, and the major diameter is measured for the two divided parts. The major diameter of the part with a larger major diameter is taken as the major diameter of the primary particle.

The content of the boron nitride in 100% by volume of the insulating sheet is preferably 20% by volume or more, more preferably 25% by volume or more, still more preferably 30% by volume or more, and particularly preferably 40% by volume or more, and preferably 80% by volume or less, more preferably 75% by volume or less, still more preferably 70% by volume or less, and particularly preferably 65% by volume or less. When the content of the boron nitride is in the range from the above lower limit to the above upper limit inclusive, the thermal conduction and the adhesiveness can be more effectively enhanced.

(Thermosetting Component: Thermosetting Compound)

The insulating sheet according to the present invention contains a thermosetting component. The thermosetting component preferably contains a thermosetting compound, and preferably contains a thermosetting agent. The thermosetting component preferably contains the thermosetting compound and the thermosetting agent. The thermosetting compound is not particularly limited. Examples of the thermosetting compound include styrene compounds, phenoxy compounds, oxetane compounds, epoxy compounds, episulfide compounds, (meth)acrylic compounds, phenol compounds, amino compounds, unsaturated polyester compounds, polyurethane compounds, silicone compounds and polyimide compounds. One kind of the thermosetting compound may be used alone, and two or more kinds thereof may be used in combination.

From the viewpoint of more effectively enhancing the thermal conduction and the adhesiveness and more effectively suppressing variation in the adhesiveness, the thermosetting compound preferably contains an epoxy compound. The epoxy compound is an organic compound having at least one epoxy group. One kind of the epoxy compound may be used alone, and two or more kinds thereof may be used in combination.

Examples of the epoxy compound include a bisphenol A type epoxy compound, a bisphenol F type epoxy compound, a bisphenol S type epoxy compound, a phenol novolac type epoxy compound, a biphenyl type epoxy compound, a biphenyl novolac type epoxy compound, a biphenol type epoxy compound, a naphthalene type epoxy compound, a fluorene type epoxy compound, a phenol aralkyl type epoxy compound, a naphthol aralkyl type epoxy compound, a dicyclopentadiene type epoxy compound, an anthracene type epoxy compound, an epoxy compound having an adamantane skeleton, an epoxy compound having a tricyclodecane skeleton, a naphthylene ether type epoxy compound, and an epoxy compound having a triazine nucleus in its skeleton.

From the viewpoint of more effectively enhancing the thermal conduction and the adhesiveness and more effectively suppressing variation in the adhesiveness, the epoxy compound is preferably a bisphenol A type epoxy compound.

From the viewpoint of more effectively enhancing the thermal conduction and the adhesiveness and more effectively suppressing variation in the adhesiveness, the content of the thermosetting compound in 100% by volume of the insulating sheet is preferably 20% by volume or more and more preferably 25% by volume or more, and preferably 80% by volume or less and more preferably 75% by volume or less.

(Thermosetting Component: Thermosetting Agent)

For the insulating sheet according to the present invention, a thermosetting agent is preferably used together with the thermosetting compound. The thermosetting agent is not particularly limited. As the thermosetting agent, a thermosetting agent capable of curing the thermosetting compound can be used suitably. Also, as used herein, the thermosetting agent includes a curing catalyst. One kind of the thermosetting agents may be used alone, and two or more kinds thereof may be used in combination.

Examples of the thermosetting agent include cyanate ester compounds (cyanate ester curing agents), phenolic compounds (phenol thermosetting agents), amine compounds (amine thermosetting agents), thiol compounds (thiol thermosetting agents), imidazole compounds, phosphine compounds, acid anhydrides, active ester compounds, and dicyandiamide. The thermosetting agent preferably has a functional group capable of reacting with an epoxy group of the epoxy compound described above.

Examples of the cyanate ester compound include novolac type cyanate ester resins, bisphenol type cyanate ester resins, and prepolymers obtained by partially trimerizing those. Examples of the novolac type cyanate ester resins include phenol novolac type cyanate ester resins, and alkylphenol type cyanate ester resins. Examples of the bisphenol type cyanate ester resins include bisphenol A type cyanate ester resins, bisphenol E type cyanate ester resins, and tetramethyl bisphenol F type cyanate ester resins.

Examples of commercially available products of the cyanate ester compound include phenol novolac type cyanate ester resins ("PT-30" and "PT-60" manufactured by Lonza Japan Ltd.), and prepolymers ("BA-230S," "BA-3000S," "BTP-1000S," and "BTP-6020S" manufactured by Lonza Japan Ltd.) obtained by trimerizing bisphenol type cyanate ester resins.

Examples of the phenolic compound include novolac type phenols, biphenol type phenols, naphthalene type phenols, dicyclopentadiene type phenols, aralkyl type phenols, and dicyclopentadiene type phenols.

Examples of commercially available products of the phenolic compound include novolac type phenols ("TD-2091" manufactured by DIC Corporation), biphenyl novolac type phenols ("MEHC-7851" manufactured by Meiwa Plastic Industries, Ltd.), aralkyl type phenolic compounds ("MEH-7800" manufactured by Meiwa Plastic Industries, Ltd.), and phenols ("LA1356" and "LA3018-50P" manufactured by DIC Corporation) having an aminotriazine skeleton.

The total content of the thermosetting compound and the thermosetting agent in 100% by volume of the insulating sheet is preferably 20% by volume or more and more preferably 25% by volume or more, and preferably 80% by volume or less and more preferably 75% by volume or less. When the total content of the thermosetting compound and the thermosetting agent is in the range from the above lower limit to the above upper limit inclusive, the thermal conduction and the adhesiveness can be more effectively enhanced, and variation in the adhesiveness can be more effectively suppressed. A content ratio of the thermosetting compound and the thermosetting agent is appropriately selected so that the thermosetting compound cures.

The content of the thermosetting agent is appropriately selected so that the thermosetting compound cures well. The content of the thermosetting agent is preferably 1 part by weight or more and more preferably 3 parts by weight or more, and preferably 50 parts by weight or less and more preferably 30 parts by weight or less based on 100 parts by weight of the thermosetting compound. When the content of the thermosetting agent is more than or equal to the above lower limit, it is more easy to sufficiently cure the thermosetting compound. When the content of the thermosetting agent is less than or equal to the above upper limit, an excess thermosetting agent that does not contribute to curing is less likely to be generated. Thus, heat resistance and adhesiveness of a cured product are further enhanced.

(Insulating Filler)

The insulating sheet according to the present invention may contain an insulating filler. The insulating filler is not the boron nitride. The insulating filler has insulation properties. The insulating filler may be an organic filler or an inorganic filler. One kind of the insulating filler may be used alone, and two or more kinds thereof may be used in combination.

From the viewpoint of more effectively enhancing the thermal conduction, the insulating filler is preferably an inorganic filler. From the viewpoint of more effectively enhancing the thermal conduction, the insulating filler preferably has a thermal conductivity of 10 W/m·K or more.

From the viewpoint of more effectively enhancing the thermal conduction, the thermal conductivity of the insulating filler is preferably 10 W/m·K or more and more preferably 20 W/m·K or more. An upper limit of the thermal conductivity of the insulating filler is not particularly limited. Inorganic fillers having a thermal conductivity of about 300 W/m·K are widely known, and inorganic fillers having a thermal conductivity of about 200 W/m·K are readily available.

The material of the insulating filler is not particularly limited. Examples of the materials of the insulating filler include nitrogen compounds (such as boron nitride, aluminum nitride, silicon nitride, carbon nitride, and titanium nitride), carbon compounds (such as silicon carbide, fluorine carbide, boron carbide, titanium carbide, tungsten carbide, and diamond), and metal oxides (such as silica, alumina, zinc oxide, magnesium oxide, and beryllium oxide). The material of the insulating filler is preferably the nitrogen compound, the carbon compound or the metal oxide, and more preferably alumina, boron nitride, aluminum nitride, silicon nitride, silicon carbide, zinc oxide, or magnesium oxide. The use of these preferred insulating fillers further increases the thermal conduction of a cured product.

The insulating filler is preferably spherical particles or non-aggregated particles and aggregated particles having an aspect ratio of more than 2. The use of these insulating fillers further increases the thermal conduction of a cured product. The aspect ratio of the spherical particles is 2 or less.

The new Mohs hardness of the material of the insulating filler is preferably 12 or less and more preferably 9 or less. When the new Mohs hardness of the material of the insulating filler is 9 or less, the processability of a cured product is further enhanced.

From the viewpoint of further enhancing the processability of a cured product, the material of the insulating filler is preferably boron nitride, synthetic magnesite, crystalline silica, zinc oxide, or magnesium oxide. The new Mohs hardness of the material of each of these insulating fillers is 9 or less.

From the viewpoint of further enhancing the thermal conduction, the particle diameter of the insulating filler is preferably 0.1 μm or more and 50 μm or less. When the particle diameter of the insulating filler is more than or equal to the above lower limit, the insulating filler can be easily filled highly densely. When the particle diameter of the insulating filler is less than or equal to the above upper limit, the thermal conduction of a cured product is further enhanced.

The particle diameter of the insulating filler is preferably an average particle diameter obtained by averaging particle diameters in terms of volume average measured with a laser diffraction particle size distribution measuring apparatus. The average particle diameter of the insulating filler can also be determined by calculating an average of the particle diameters of 50 insulating filler particles selected randomly.

From the viewpoint of more effectively enhancing the thermal conduction, the content of the insulating filler in 100% by volume of the insulating sheet is preferably 1% by volume or more and more preferably 3% by volume or more, and preferably 30% by volume or less and more preferably 25% by volume or less.

(Other Ingredients)

Other than the above-described ingredients, the insulating sheet may include other ingredients, which are generally used for a resin sheet and a curable sheet, such as a dispersant, a chelating agent, and an oxidation inhibitor.

(Laminate)

The laminate according to the present invention includes a thermal conductor, an insulating layer, and a conductive layer. The insulating layer is laminated on one surface of the thermal conductor. The conductive layer is laminated on a surface of the insulating layer opposite to the thermal conductor. The insulating layer may be laminated also on the other surface of the thermal conductor. In the laminate according to the present invention, the material of the insulating layer is the insulating sheet described above.

Thermal Conductor:

The thermal conductivity of the thermal conductor is preferably 10 W/m·K or more. As the thermal conductor, an appropriate thermal conductor can be used. The thermal conductor is preferably a metal material. Examples of the metal material include metal foil and a metal plate. The thermal conductor is preferably the metal foil or the metal plate and more preferably the metal plate.

Examples of the material of the metal material include aluminum, copper, gold, silver, a graphite sheet, From the viewpoint of more effectively enhancing the thermal conduction, the material of the metal material is preferably aluminum, copper or gold, and more preferably aluminum or copper.

Conductive Layer:

The metal for forming the conductive layer is not particularly limited. Examples of the metal include gold, silver, palladium, copper, platinum, zinc, iron, tin, lead, aluminum, cobalt, indium, nickel, chromium, titanium, antimony, bismuth, thallium, germanium, cadmium, silicon, tungsten, molybdenum, and alloys of these. Further examples of the metal include tin-doped indium oxide (ITO) and solder. From the viewpoint of more effectively enhancing the thermal conduction, the metal is preferably aluminum, copper or gold, and more preferably aluminum or copper.

A method of forming the conductive layer is not particularly limited. Examples of the method of forming the conductive layer include a method by electroless plating, a method by electroplating, and a method of thermocompression-bonding the insulating layer and metal foil. The method of thermocompression-bonding the insulating layer and metal foil is preferable because the conductive layer can be formed in a simple manner.

FIG. 1 is a cross-sectional view schematically showing an insulating sheet according to an embodiment of the present invention. For convenience of illustration, the size and thickness shown in FIG. 1 are different from the actual size and thickness.

An insulating sheet 1 shown in FIG. 1 contains a thermosetting component 11 and boron nitride 12. The boron nitride 12 is preferably the above-described boron nitride.

The insulating sheet 1 according to the present embodiment has one surface (first surface) 1a and the other surface (second surface) 1b. In the insulating sheet 1 according to the present embodiment, the first average aspect ratio of the boron nitride 12 in a region having a thickness of 10% of the thickness of the sheet, from the first surface 1a toward the second surface 1b is smaller than the second average aspect ratio of the boron nitride 12 in a region having a thickness of 90% of the thickness of the sheet, from the second surface 1b toward the first surface 1a. The first average aspect ratio of the boron nitride 12 in the region having a thickness of 10% of the thickness of the sheet, from the first surface 1a toward the second surface 1b is preferably smaller than the third average aspect ratio of the boron nitride 12 in a region having a thickness of 80% of the thickness of the sheet, that is from a position 1/10 of the thickness of the sheet to a position 9/10 of the thickness of the sheet from the first surface 1a toward the second surface 1b.

In the insulating sheet 1 according to the present embodiment, the thermosetting component 11 may contain a thermosetting agent. The thermosetting component is preferably not completely cured. The thermosetting component may be B-staged by heating or the like. The thermosetting component may be a B-staged product.

FIG. 2 is a cross-sectional view schematically showing a laminate obtained using the insulating sheet according to one embodiment of the present invention. For convenience of illustration, the size and thickness shown in FIG. 2 are different from the actual size and thickness.

A laminate 21 shown in FIG. 2 includes an insulating layer 22, a conductive layer 23, and a thermal conductor 24. The insulating layer 22, the conductive layer 23, and the thermal conductor 24 are the above-described insulating layer, conductive layer, and thermal conductor. In FIG. 2, the insulating sheet 1 shown in FIG. 1 is used as the insulating layer 22.

The insulating layer 22 has one surface (first surface) 22a and the other surface (second surface) 22b. The conductive layer 23 has one surface (first surface) 23a and the other surface (second surface) 23b. The insulating layer 24 has one surface (first surface) 24a and the other surface (second surface) 24b.

The conductive layer 23 is laminated on the side of one surface (first surface) 22a of the insulating layer 22. The thermal conductor 24 is laminated on the side of the other surface (second surface) 22b of the insulating layer 22. The insulating layer 22 is laminated on the side of the other surface (second surface) 23b of the conductive layer 23. The insulating layer 22 is laminated on the side of one surface (first surface) 24a of the thermal conductor 24. The insulating layer 22 is disposed between the conductive layer 23 and the thermal conductor 24.

The method of producing the laminate is not particularly limited. Examples of the method of producing the laminate include a method in which the thermal conductor, the insulating layer, and the conductive layer are stacked and thermocompression-bonded by vacuum pressing or the like.

In the laminate 21 according to the present embodiment, the insulating layer 22 includes a cured product portion 25 and the boron nitride 12. The insulating layer 22 is formed by the insulating sheet 1 shown in FIG. 1. It is preferable that the insulating layer be formed by thermocompression-bonding the insulating sheet described above by vacuum pressing or the like.

In the laminate 21 according to the present embodiment, the first average aspect ratio of the boron nitride 12 in a region having a thickness of 10% of the thickness of the sheet, from the first surface 22a toward the second surface 22b of the insulating layer 22 is smaller than the second average aspect ratio of the boron nitride 12 in a region having a thickness of 90% of the thickness of the sheet, from the second surface 22b toward the first surface 22a of the insulating layer 22.

In the present embodiment, the cured product portion 1025 is portion in which the thermosetting component 11 in FIG. 1 is cured. The cured product portion 25 is obtained by curing the thermosetting component 11. The cured product portion 25 may be a portion in which a thermosetting component containing a thermosetting compound and a thermosetting agent is cured.

The insulating sheet can be used in various applications where high thermal conduction, high mechanical strength, and the like are required. For example, the laminate is disposed between a heat generation component and a heat dissipation component to be used in electronic equipment. For example, the laminate is used as a radiator installed between a CPU and a fin or a radiator of a power card used in inverters of electric vehicles and the like. Further, the laminate may be used as an insulating circuit board by forming a circuit by etching or the like of the conductive layer of the laminate.

Hereinafter, the present invention will be clarified by way of specific examples and comparative examples of the present invention. The present invention is not limited to the following examples.

Thermosetting Component (Thermosetting Compound):
(1) "Epicoat 828US" manufactured by Mitsubishi Chemical Corporation, epoxy compound Thermosetting Component (Thermosetting Agent):
(1) "Dicyandiamide" manufactured by Tokyo Chemical Industry Co., Ltd.
(2) "2MZA-PW" manufactured by Shikoku Chemicals Corporation, isocyanurate-modified solid dispersed imidazole Boron Nitride:
(1) "HP-40" manufactured by Mizushima Ferroalloy Co., Ltd., average aspect ratio: 6, average major diameter: 7 μm
(2) "PTX60" manufactured by Momentive Performance Materials Inc., average aspect ratio: 13, average major diameter: 7 μm
(3) "UHP-G1H" manufactured by SHOWA DENKO K.K., average aspect ratio: 6, average major diameter: 3 μm (Average Aspect Ratio of Boron Nitride)

The average aspect ratio of boron nitride was measured as follows.

Method of Measuring Average Aspect Ratio of Boron Nitride:

The average aspect ratio of the boron nitride was obtained by mixing the boron nitride or the primary particles constituting the boron nitride agglomerated particles with thermosetting resin or the like, measuring the major diameter/minor diameter of each of 50 boron nitride particles (primary particles) randomly selected from an electron microscope image of a cross section of a sheet or a laminate produced by pressing, and calculating an average value. When the primary particle had a bent shape, the primary particle was divided into two parts at a bending point, and the major diameter was measured for the two divided parts. The major diameter/minor diameter calculated from the part with a larger major diameter was taken as the major diameter/minor diameter of the primary particle.

(Average Major Diameter of Boron Nitride)

The average major diameter of boron nitride was measured as follows.

Method of Measuring Average Major Diameter of Boron Nitride:

The average major diameter of the boron nitride was obtained by mixing the boron nitride or the primary particles constituting the boron nitride agglomerated particles with thermosetting resin or the like, measuring the major diameter of each of 50 boron nitride particles (primary particles) randomly selected from an electron microscope image of a cross section of a sheet or a laminate produced by pressing, and calculating an average value. When the primary particle had a bent shape, the primary particle was divided into two parts at a bending point, and the major diameter was measured for the two divided parts. The major diameter of the part with a larger major diameter was taken as the major diameter of the primary particle.

Insulating Filler (Alumina):

(1) "A20S" manufactured by SHOWA DENKO K.K., average aspect ratio: 1, average major diameter: 20 μm, particle diameter: 20 μm

Example 1

(1) Preparation of Curable Materials A and B

A thermosetting compound and a thermosetting agent were blended such that based on 100 parts by weight of "Epicoat 828US" manufactured by Mitsubishi Chemical Corporation, "Dicyandiamide" manufactured by Tokyo Chemical Industry Co., Ltd. had an amount of 10 parts by weight, and "2MZA-PW" manufactured by Shikoku Chemicals Corporation had an amount of 1 part by weight. Next, boron nitride indicated in Table 1 below was blended in the blending amount (% by volume) indicated in Table 1 below, and stirred with a planetary stirrer at 500 rpm for 25 minutes to obtain the curable materials A and B.

(2) Production of Laminate

The obtained curable material A was coated on a release PET sheet (50 μm thick) to have a thickness of 100 μm and dried in an oven at 50° C. for 20 minutes to form a first curable material layer. Next, the obtained curable material B was coated on the first curable material layer to have a thickness of 250 μm and dried in an oven at 50° C. for 20 minutes to form a second curable material layer, and thus to obtain an insulating sheet. The obtained insulating sheet has a first surface which is the surface of the first curable material layer formed, and a second surface which is the surface of the second curable material layer formed.

Thereafter, the release PET sheet was peeled off, copper foil was stacked on the first surface of the insulating sheet, and an aluminum plate was stacked on the second surface of the insulating sheet. The stacked layers were vacuum-pressed at a temperature of 200° C. and a pressure of 10 MPa to produce a laminate. That is, the obtained laminate includes a thermal conductor, an insulating layer laminated on one surface of the thermal conductor, and a conductive layer laminated on a surface of the insulating layer opposite to the thermal conductor, and a material of the insulating layer is the obtained insulating sheet. The thickness of the insulating layer of the obtained laminate was 245 μm.

Example 2

In the same manner as in Example 1, curable materials A and B were obtained. The obtained curable material A was coated on a release PET sheet (50 μm thick) to have a thickness of 50 μm and dried in an oven at 50° C. for 20 minutes to form a first curable material layer. Next, the obtained curable material B was coated on the first curable material layer to have a thickness of 200 μm and dried in an oven at 50° C. for 20 minutes to form a second curable material layer. Furthermore, the obtained curable material A was coated on the second curable material layer to have a thickness of 50 μm and dried in an oven at 50° C. for 20 minutes to form a third curable material layer, and thus to obtain an insulating sheet. The obtained insulating sheet has a first surface which is the surface of the first curable material layer formed, and a second surface which is the surface of the third curable material layer formed.

Thereafter, the release PET sheet was peeled off, copper foil was stacked on the first surface of the insulating sheet, and an aluminum plate was stacked on the second surface of the insulating sheet. The stacked layers were vacuum-pressed at a temperature of 200° C. and a pressure of 10 MPa to produce a laminate. That is, the obtained laminate includes a thermal conductor, an insulating layer laminated on one surface of the thermal conductor, and a conductive layer laminated on a surface of the insulating layer opposite to the thermal conductor, and a material of the insulating layer is the obtained insulating sheet. The thickness of the insulating layer of the obtained laminate was 245 μm.

Example 3

A laminate was obtained in the same manner as Example 1, except that: in the process of producing the curable material A, "A20S" was blended, and the blending amount of "A20S" was set to 10% by volume; and in the process of producing the curable material B, "A20S" was blended, and the blending amount of "A20S" was set to 10% by volume. The thickness of the insulating layer of the obtained laminate was 245 μm.

Example 4

A laminate was obtained in the same manner as Example 2, except that: in the process of producing the curable material A, "A20S" was blended, and the blending amount of "A20S" was set to 10% by volume; and in the process of producing the curable material B, "A20S" was blended, and the blending amount of "A20S" was set to 10% by volume. The thickness of the insulating layer of the obtained laminate was 245 μm.

Example 5

A laminate was obtained in the same manner as Example 1, except that in the process of producing the curable material A, "A20S" was blended, and the blending amount of "A20S" was set to 10% by volume. The thickness of the insulating layer of the obtained laminate was 245 μm.

Example 6

A laminate was obtained in the same manner as Example 2, except that in the process of producing the curable material A, "A20S" was blended, and the blending amount of "A20S" was set to 10% by volume. The thickness of the insulating layer of the obtained laminate was 245 μm.

Example 7

A laminate was obtained in the same manner as Example 1, except that in the process of producing the curable material B, "A20S" was blended, and the blending amount of "A20S" was set to 10% by volume. The thickness of the insulating layer of the obtained laminate was 245 μm.

Example 8

A laminate was obtained in the same manner as Example 2, except that in the process of producing the curable material B, "A20S" was blended, and the blending amount of "A20S" was set to 10% by volume. The thickness of the insulating layer of the obtained laminate was 245 μm.

Example 9

A laminate was obtained in the same manner as Example 1, except that boron nitride was changed from "HP-40" to "UHP-G1H" in the process of producing the curable material A. The thickness of the insulating layer of the obtained laminate was 245 μm.

Example 10

A laminate was obtained in the same manner as Example 2, except that boron nitride was changed from "HP-40" to "UHP-G1H" in the process of producing the curable material A. The thickness of the insulating layer of the obtained laminate was 245 μm.

Example 11

A laminate was obtained in the same manner as Example 1, except that: in the process of producing the curable material A, boron nitride was changed from "HP-40" to "UHP-G1H", "A20S" was blended, and the blending amount of "A20S" was set to 10% by volume; and in the process of producing the curable material B, "A20S" was blended, and the blending amount of "A20S" was set to 10% by volume. The thickness of the insulating layer of the obtained laminate was 245 μm.

Example 12

A laminate was obtained in the same manner as Example 2, except that: in the process of producing the curable material A, boron nitride was changed from "HP-40" to "UHP-G1H", "A20S" was blended, and the blending amount of "A20S" was set to 10% by volume; and in the process of producing the curable material B, "A20S" was blended, and the blending amount of "A20S" was set to 10% by volume. The thickness of the insulating layer of the obtained laminate was 245 μm.

Example 13

A laminate was obtained in the same manner as Example 1, except that in the process of producing the curable material A, boron nitride was changed from "HP-40" to "UHP-G1H", "A20S" was blended, and the blending amount of "A20S" was set to 10% by volume. The thickness of the insulating layer of the obtained laminate was 245 μm.

Example 14

A laminate was obtained in the same manner as Example 2, except that in the process of producing the curable material A, boron nitride was changed from "HP-40" to "UHP-G1H", "A20S" was blended, and the blending amount of "A20S" was set to 10% by volume. The thickness of the insulating layer of the obtained laminate was 245 μm.

Example 15

A laminate was obtained in the same manner as Example 1, except that: boron nitride was changed from "HP-40" to "UHP-G1H" in the process of producing the curable material A; and in the process of producing the curable material B, "A20S" was blended, and the blending amount of "A20S" was set to 10% by volume. The thickness of the insulating layer of the obtained laminate was 245 μm.

Example 16

A laminate was obtained in the same manner as Example 2, except that: boron nitride was changed from "HP-40" to "UHP-G1H" in the process of producing the curable material A; and in the process of producing the curable material B, "A20S" was blended, and the blending amount of "A20S" was set to 10% by volume. The thickness of the insulating layer of the obtained laminate was 245 μm.

Comparative Example 1

A laminate was produced in the same manner as Example 1, except that boron nitride was changed from "HP-40" to "PTX60" in the process of producing the curable material A, the curable material B was not produced, and the curable material A was used instead of the curable material B. The thickness of the insulating layer of the obtained laminate was 245 μm.

Comparative Example 2

A laminate was produced in the same manner as Example 1, except that the curable material B was not produced, and the curable material A was used instead of the curable material B. The thickness of the insulating layer of the obtained laminate was 245 μm.

(Evaluation)
(1) Average Aspect Ratio of Boron Nitride

The cross section of the obtained laminate was processed for smoothing by a cross section polisher ("IB-19500CP" manufactured by JEOL Ltd.), and the cross section of the processed laminate was observed by a field emission scanning electron microscope ("S-4800" manufactured by Hitachi High-Technologies Corporation). Boron nitride was identified by an energy dispersive X-ray spectrometer ("S-4800EN-EDS" manufactured by Hitachi High-Technologies Corporation). The first average aspect ratio of boron nitride in the region having a thickness of 10% of the thickness of the sheet, from the first surface of the insulating sheet toward the second surface of the insulating sheet and the second average aspect ratio of boron nitride in the region having a thickness of 90% of the thickness of the sheet, from the second surface of the insulating sheet toward the first surface of the insulating sheet were calculated from the obtained electron microscope image. Further, the third average aspect ratio of the boron nitride in the region having a thickness of 80% of the thickness of the sheet, that is from the position 1/10 of the thickness of the sheet to the position 9/10 of the thickness of the sheet from the first surface of the insulating sheet toward the second surface of the insulating sheet was calculated. Furthermore, the fourth average aspect ratio of boron nitride in the region having a thickness of 10% of the thickness of the sheet, from the second surface of the insulating sheet toward the first surface of the insulating sheet was calculated.

(2) Thermal Conductivity

The obtained laminate was cut into 1 cm squares, and then carbon black was sprayed on both sides to prepare a measurement sample. The thermal conductivity was calculated by a laser flash method using the obtained measurement sample. A relative value obtained when the value of Comparative Example 1 was expressed as 1.0 was calculated, and the thermal conductivity was judged on the basis of the following criteria.

[Criteria for Judgment in Thermal Conductivity]
 ◯◯: thermal conductivity was 1.5 or more.
 ◯: thermal conductivity was more than 1.0 and less than 1.5.
 Δ: Comparative Example 1 (1.0), or thermal conductivity was equivalent to Comparative Example 1 (1.0).
 x: thermal conductivity was less than 1.0.

(3) 90 Degree Peel Strength

The obtained laminate was cut out to the size of 50 mm×120 mm to obtain a Lest sample. Copper foil was peeled off so that copper foil with a width of 10 mm was left in the center of the obtained test sample, and the peel strength of the copper foil was measured according to JIS C 6481 with respect to the copper foil with a width of 10 mm in the center. As a peel strength tester for measuring the peel strength, a "Tensilon universal testing machine" manufactured by Orientec K.K. was used. For 20 test samples, the peel strength of the copper foil was measured to obtain 20 measured values of 90 degree peel strength. An average value of the 20 measured values of the 90 degree peel strength was taken as the 90 degree peel strength. A relative value obtained when the value of Comparative Example 1 was expressed as 1.0 was calculated, and the 90 degree peel strength was judged on the basis of the following criteria.

[Criteria for Judgment in 90 Degree Peel Strength]
 ◯◯: 90 degree peel strength was 1.5 or more.
 ◯: 90 degree peel strength was more than 1.0 and less than 1.5.
 Δ: Comparative Example 1 (1.0), or 90 degree peel strength was equivalent to Comparative Example 1 (1.0).
 x: 90 degree peel strength was less than 1.0.

(4) Variation in Adhesiveness

In the evaluation of (3), variation in adhesiveness was judged on the basis of the following criteria from 20 measured values of the 90 degree peel strength.

[Criteria for Judgment in Variation in Adhesiveness]
 ◯◯: a difference between a maximum value and a minimum value of the 90 degree peel strength was less than 0.3 N/10 mm.
 ◯: the difference between the maximum value and the minimum value of the 90 degree peel strength was 0.3 N/10 mm or more and less than 0.7 N/10 mm.
 x: the difference between the maximum value and the minimum value of the 90 degree peel strength was 0.7 N/10 mm or more.

Tables 1 to 3 below show the configurations and results of the insulating sheet.

TABLE 1

| | | | Example 1 | Example 2 | Example 3 | Example 4 | Example 5 | Example 6 |
|---|---|---|---|---|---|---|---|---|
| Curable material A | Amount (vol %) of boron nitride | HP-40 | 55 | 55 | 55 | 55 | 55 | 55 |
| | | PTX60 | | | | | | |
| | | UHP-G1H | | | | | | |
| | Amount (vol %) of alumina | A20S | | | 10 | 10 | 10 | 10 |
| Curable material B | Amount (vol %) of boron nitride | HP-40 | | | | | | |
| | | PTX60 | 55 | 55 | 55 | 55 | 55 | 55 |
| | Amount (vol %) of alumina | A20S | | | 10 | 10 | | |
| Content (vol %) of boron nitride in 100 vol % of insulating sheet | | | 55 | 55 | 55 | 55 | 55 | 55 |
| Evaluation | Average aspect ratio of boron nitride | First average aspect ratio | 6 | 6 | 6 | 6 | 6 | 6 |
| | | Second average aspect ratio | 12.5 | 12.5 | 12.5 | 12.5 | 12.5 | 12.5 |
| | | Third average aspect ratio | 12.3 | 12.1 | 12.3 | 12.1 | 12.3 | 12.1 |
| | | Fourth average aspect ratio | 13 | 6 | 13 | 6 | 13 | 6 |
| | Thermal conductivity | | ◯◯ | ◯◯ | ◯◯ | ◯◯ | ◯◯ | ◯◯ |
| | 90 degree peel strength | | ◯◯ | ◯◯ | ◯◯ | ◯◯ | ◯◯ | ◯◯ |
| | Variation in adhesiveness | | ◯◯ | ◯◯ | ◯◯ | ◯◯ | ◯◯ | ◯◯ |

TABLE 2

| | | | Example 7 | Example 8 | Example 9 | Example 10 | Example 11 | Example 12 |
|---|---|---|---|---|---|---|---|---|
| Curable material A | Amount (vol %) of boron nitride | HP-40 | 55 | 55 | | | | |
| | | PTX60 | | | | | | |
| | | UHP-G1H | | | 55 | 55 | 55 | 55 |
| | Amount (vol %) of alumina | A20S | | | | | 10 | 10 |

TABLE 2-continued

|  |  |  | Example 7 | Example 8 | Example 9 | Example 10 | Example 11 | Example 12 |
|---|---|---|---|---|---|---|---|---|
| Curable material B | Amount (vol %) of boron nitride | HP-40 |  |  |  |  |  |  |
|  |  | PTX60 | 55 | 55 | 55 | 55 | 55 | 55 |
|  | Amount (vol %) of alumina | A20S | 10 | 10 |  |  | 10 | 10 |
| Content (vol %) of boron nitride in 100 vol % of insulating sheet |  |  | 55 | 55 | 55 | 55 | 55 | 55 |
| Evaluation | Average aspect ratio of boron nitride | First average aspect ratio | 6 | 6 | 6 | 6 | 6 | 6 |
|  |  | Second average aspect ratio | 12.5 | 12.5 | 12.5 | 12.5 | 12.5 | 12.5 |
|  |  | Third average aspect ratio | 12.3 | 12.1 | 12.3 | 12.1 | 12.3 | 12.1 |
|  |  | Fourth average aspect ratio | 13 | 6 | 13 | 6 | 13 | 6 |
|  | Thermal conductivity |  | ∘∘ | ∘∘ | ∘∘ | ∘∘ | ∘∘ | ∘∘ |
|  | 90 degree peel strength |  | ∘∘ | ∘∘ | ∘∘ | ∘∘ | ∘∘ | ∘∘ |
|  | Variation in adhesiveness |  | ∘∘ | ∘∘ | ∘∘ | ∘∘ | ∘∘ | ∘∘ |

TABLE 3

|  |  |  | Example 13 | Example 14 | Example 15 | Example 16 | Comparative Example 1 | Comparative Example 2 |
|---|---|---|---|---|---|---|---|---|
| Curable material A | Amount (vol %) of boron nitride | HP-40 |  |  |  |  |  | 55 |
|  |  | PTX60 |  |  |  |  | 55 |  |
|  |  | UHP-G1H | 55 | 55 | 55 | 55 |  |  |
|  | Amount (vol %) of alumina | A20S | 10 | 10 |  |  |  |  |
| Curable material B | Amount (vol %) of boron nitride | HP-40 |  |  |  |  |  |  |
|  |  | PTX60 | 55 | 55 | 55 | 55 |  |  |
|  | Amount (vol %) of alumina | A20S |  |  | 10 | 10 |  |  |
| Content (vol %) of boron nitride in 100 vol % of insulating sheet |  |  | 55 | 55 | 55 | 55 | 55 | 55 |
| Evaluation | Average aspect ratio of boron nitride | First average aspect ratio | 6 | 6 | 6 | 6 | 13 | 6 |
|  |  | Second average aspect ratio | 12.5 | 12.5 | 12.5 | 12.5 | 13 | 6 |
|  |  | Third average aspect ratio | 12.3 | 12.1 | 12.3 | 12.1 | 13 | 6 |
|  |  | Fourth average aspect ratio | 13 | 6 | 13 | 6 | 13 | 6 |
|  | Thermal conductivity |  | ∘∘ | ∘∘ | ∘∘ | ∘∘ | Δ | x |
|  | 90 degree peel strength |  | ∘∘ | ∘∘ | ∘∘ | ∘∘ | Δ | ∘ |
|  | Variation in adhesiveness |  | ∘∘ | ∘∘ | ∘∘ | ∘∘ | x | ∘ |

EXPLANATION OF SYMBOLS

1: Insulating sheet
1a: One surface (first surface)
1b: The other surface (second surface)
11: Thermosetting component
12: Boron nitride
21: Laminate
22: Insulating layer
22a: One surface (first surface)
22b: The other surface (second surface)
23: Conductive layer
23a: One surface (first surface)
23b: The other surface (second surface)
24: Thermal conductor
24a: One surface (first surface)
24b: The other surface (second surface)
25: Cured product portion (portion in which thermosetting component is cured)

The invention claimed is:

1. An insulating sheet comprising:
a thermosetting component; and
boron nitride,
the insulating sheet having a first surface on one side in a thickness direction and a second surface on the other side in the thickness direction,
wherein a first average aspect ratio of the boron nitride in a region having a thickness of 10% of a thickness of the sheet, from the first surface toward the second surface, is smaller than a third average aspect ratio of the boron nitride in a region having a thickness of 80% of the thickness of the sheet, that is from a position 1/10 of the thickness of the sheet to a position 9/10 of the thickness of the sheet from the first surface toward the second surface, and a fourth average aspect ratio of the boron nitride in a region having a thickness of 10% of the thickness of the sheet, from the second surface toward the first surface, is smaller than the third average aspect ratio.

2. The insulating sheet according to claim 1, wherein the first average aspect ratio is 2 or more and 20 or less.

3. The insulating sheet according to claim 1, wherein an average major diameter of the boron nitride of the entire insulating sheet is 1 μm or more and 40 μm or less.

4. The insulating sheet according to claim 1, wherein a content of the boron nitride in the entire insulating sheet is 20% by volume or more and 80% by volume or less in 100% by volume of the entire insulating sheet.

5. A laminate comprising:
a thermal conductor;
an insulating layer laminated on one surface of the thermal conductor; and
a conductive layer laminated on a surface of the insulating layer opposite to the thermal conductor,
wherein a material of the insulating layer is the insulating sheet according to claim 1.

* * * * *